(12) United States Patent
Tomizawa et al.

(10) Patent No.: US 7,348,133 B2
(45) Date of Patent: Mar. 25, 2008

(54) METHOD OF MANUFACTURING SOLID-STATE IMAGE SENSING DEVICE

(75) Inventors: Isamu Tomizawa, Gifu (JP); Seiji Kai, Gifu (JP); Kouji Yagi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 702 days.

(21) Appl. No.: 10/911,649

(22) Filed: Aug. 5, 2004

(65) Prior Publication Data

US 2005/0042550 A1 Feb. 24, 2005

(30) Foreign Application Priority Data

Aug. 6, 2003 (JP) .............................. 2003-288151

(51) Int. Cl.
*G03F 7/00* (2006.01)
(52) U.S. Cl. ...................... 430/313; 430/316; 430/319; 430/323; 257/294
(58) Field of Classification Search ................ 430/313, 430/316, 319, 323; 257/290, 222, 294
See application file for complete search history.

(56) References Cited

U.S. PATENT DOCUMENTS

2003/0168678 A1* 9/2003 Konishi ...................... 257/290

FOREIGN PATENT DOCUMENTS

| JP | 9-27608 | * | 1/1997 |
| JP | 2000-091548 | | 3/2000 |

* cited by examiner

*Primary Examiner*—Thorl Chea
(74) *Attorney, Agent, or Firm*—Morrison & Foerster LLP

(57) ABSTRACT

The invention provides a manufacturing method of a solid-state image sensing device where light-receiving sensitivity is improved. The manufacturing method of the solid-state image sensing device of the invention has forming an insulating film on a light-receiving region and a non-light-receiving region, forming a mask pattern for forming a lens on the insulating film on the light-receiving region and a dummy mask pattern for forming a lens on the insulating film on the non-light-receiving region, forming a plurality of convex portions on the insulating film by etching the insulating film by using the mask pattern and the dummy mask pattern as a mask, forming a first lens film on the insulating film, forming a planarizing film having a lower etching rate than the first lens film on the first lens film, etching back the first lens film and the planarizing film, and forming a second lens film on the first lens film.

14 Claims, 13 Drawing Sheets

METHOD OF MANUFACTURING SOLID-STATE IMAGE SENSING DEVICE

CROSS-REFERENCE OF THE INVENTION

This invention is based on Japanese Patent Application No. 2003-288151, the content of which is incorporated by reference in its entirety.

BACKGROUND OF THE INVENTION

1. Field of the Invention

This invention relates to a manufacturing method of a solid-state image sensing device in which light-receiving efficiency is improved.

2. Description of the Related Art

In recent years, the solid-state image sensing device such as CCD (charge coupled device) has been used for a cellular phone or a recognizing device, and its application range has been broadening.

An example of a structure of a conventional solid-state image sensing device will be described with reference to drawings.

FIG. 12 is a schematic view of a structure of a conventional solid-state image sensing device employing a frame transfer system. A solid-state image sensing device 1 employing the frame transfer system has an image sensing portion 1i, an accumulating portion 1s, a horizontal transferring portion 1h and an outputting portion 1d. The image sensing portion 1i has a plurality of vertical shift resistors arrayed in parallel to each other in a vertical direction, and each bit of the vertical shift resistors corresponds to each of light-receiving pixels. The accumulating portion 1s has a plurality of the vertical shift resistors connected to the vertical shift resistors forming the image sensing portion 1i. The horizontal transferring portion 1h has horizontal shift resistors arrayed in a column on an output side of the accumulating portion 1s, and each bit of the horizontal shift resistors corresponds to each of the columns of the vertical shift resistors. The outputting portion 1d has a capacitor for receiving information load outputted from the horizontal transferring portion 1h.

Under this configuration, information load generated at the light-receiving pixels forming the image sensing portion 1i is stored in each of light-receiving regions for a predetermined time, and transferred to the accumulating portion 1s at high speed in response to a frame transfer clock φf. The information load is temporarily accumulated in the accumulating portion 1s, and then sequentially transferred to the horizontal transferring portion 1h line by line in response to a vertical transfer clock φv.

The information load transferred in the horizontal transferring portion 1h is sequentially transferred to the outputting portion 1d pixel by pixel, converted into a voltage value each time, and outputted as a pixel signal Y(t).

FIG. 13 is a plan view of a partial structure of the image sensing portion 1i, and FIG. 14 is a cross-sectional view of FIG. 13 along a line X-X. This structure is constructed as follows.

A P-type diffusing layer 3 to be an element region is formed on a main surface of a N-type silicon substrate 2. On a front surface region of this P-type diffusing layer 3, a plurality of separated regions 4 injected with P-type impurity at a high concentration are disposed in parallel to each other at predetermined intervals. Between the separated regions 4, a plurality of channel regions 5 formed of a N-type diffusing layer is formed, serving as a transfer route of the information load. On the channel regions 5, a plurality of transfer electrodes 7 made of poly-crystallized silicon is disposed in parallel to each other extending in a direction crossing the channel regions 5 with a gate insulating film 6 made of thin silicon oxide interposed between the channel regions 5 and the transfer electrodes 7. Each of these transfer electrodes 7 is applied with frame transfer clocks φf1 to φf3 of three phases, and potential of the channel regions 5 is controlled by these clock pulses.

The transfer electrodes 7 are formed with an interlayer insulating film made of the same material as that of the gate insulating film 6. A plurality of power supply lines 8 made of, for example, aluminum, is formed on the interlayer insulating film so as to cover the separated regions 4. The power supply lines 8 are connected to the transfer electrodes 7 at intersections between the separated regions 4 through the contact hole 11 formed at predetermined intervals in the interlayer insulating film. For example, in three-phase driving, the contact holes 11 are provided at every three transfer electrodes 7, and the power supply lines 8 are connected with the transfer electrodes 7 at every three transfer electrodes 7. An interlayer insulating film 9 is formed so as to cover the power supply lines 8, and a protecting film 10 made of silicon nitride is further formed on this interlayer insulting film 9.

However, in the solid-state image sensing device described above, the power supply lines 8 are formed so as to cover the separated regions 4 on the light-receiving region. A aluminum materials used for the power supply lines 8 generally have characteristics of reflecting light. Therefore, among light incident on the light-receiving region, the light incident on the power supply line 8 is reflected at a front surface of the power supply line 8. Accordingly, the light incident on the power supply line 8 does not enter the channel region 5 so that the information load is not taken in.

SUMMARY OF THE INVENTION

The invention provides a method of manufacturing a solid-state image sensing device comprising a light-receiving region including a plurality of pixels and a non-light-receiving region adjacent the light-receiving region. The method includes forming an insulating film on the light-receiving region and the non-light-receiving region, forming a mask pattern on the insulating film at the light-receiving region and forming a dummy mask pattern on the insulating film at the non-light-receiving region, etching the insulating film using the mask pattern and the dummy mask pattern as a mask so as to form a plurality of convex portions on the insulating film, forming a lens film on the etched insulating film, and forming a planarizing film on the lens film, and etching back the lens film and the planarizing film. The planarizing film has a lower etching rate than the lens film.

In the above manufacturing method of the solid-state image sensing device of the invention, light incident on and shielded by a power supply line can be directed to a pixel by providing the first and second lens films. This enables efficient photoelectric conversion of incident light and improves light-receiving efficiency of the solid-state image sensing device.

Furthermore, the first and second lens films are formed on boundaries of the pixels in the light-receiving region, and also formed in the non-light-receiving region formed no pixel at the same intervals as those of the pixels formed in the light-receiving region. This makes each shape of lower and upper lens films in the light-receiving region uniform, thereby preventing irregular color caused by non-uniformity of a lens shape. The manufacturing method of the solid-state image sensing device of the invention can be realized without increasing the number of conventional steps.

DETAILED DESCRIPTION OF THE INVENTION

A manufacturing method of a solid-state image sensing device of an embodiment of the invention will be described with reference to drawings.

Figure 1:
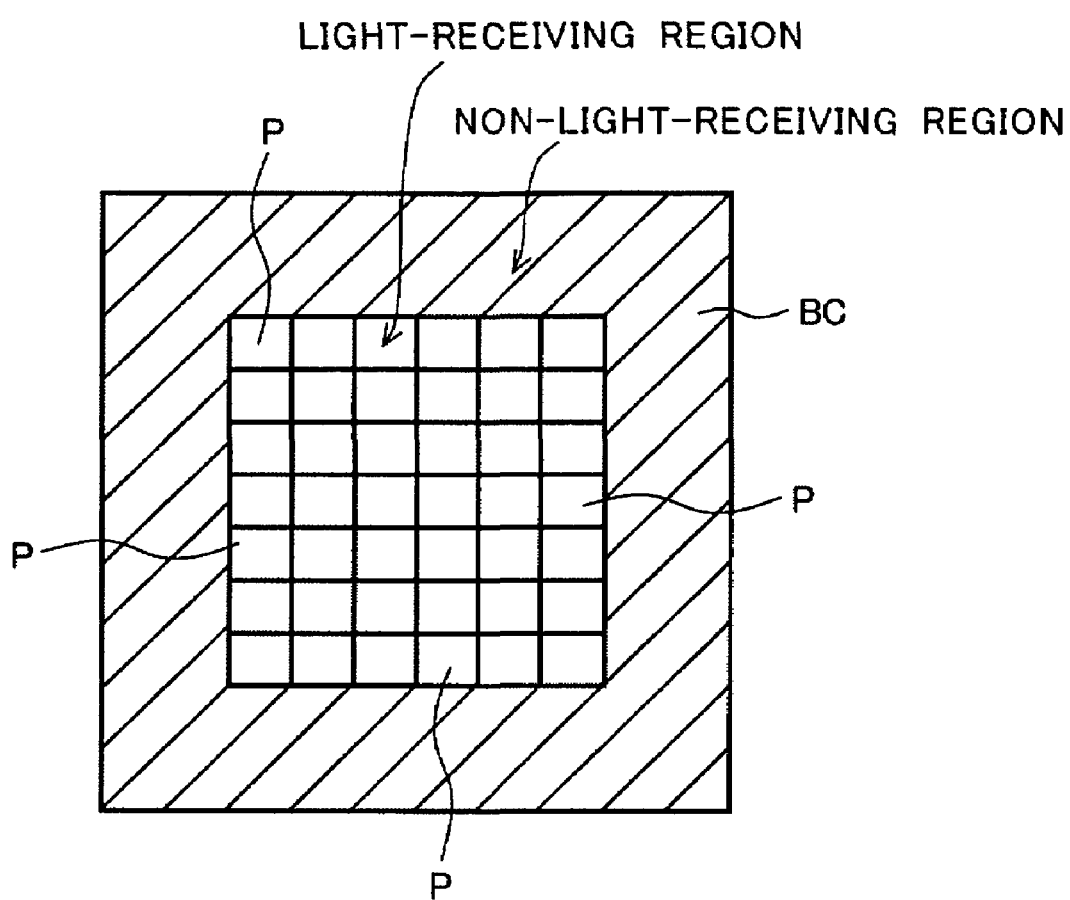
FIG. 1 is a schematic plan view of a solid-state image sensing device of an embodiment of the invention.
Figure 13:
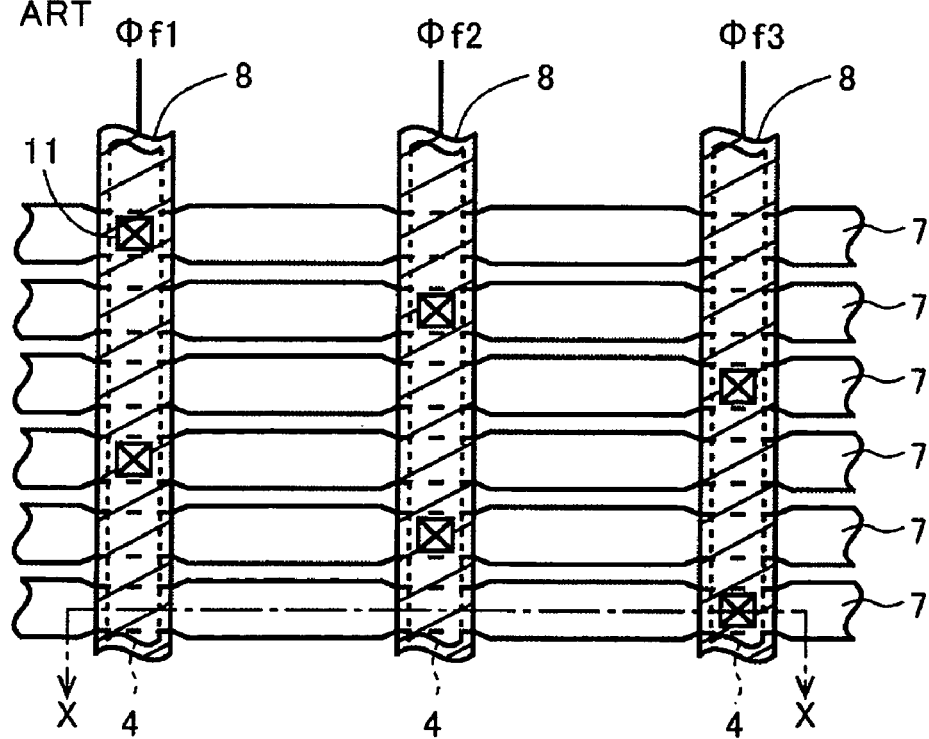
FIG. 13 is a partial plan view showing a structure of the conventional solid-state image sensing device.
Figure 14:
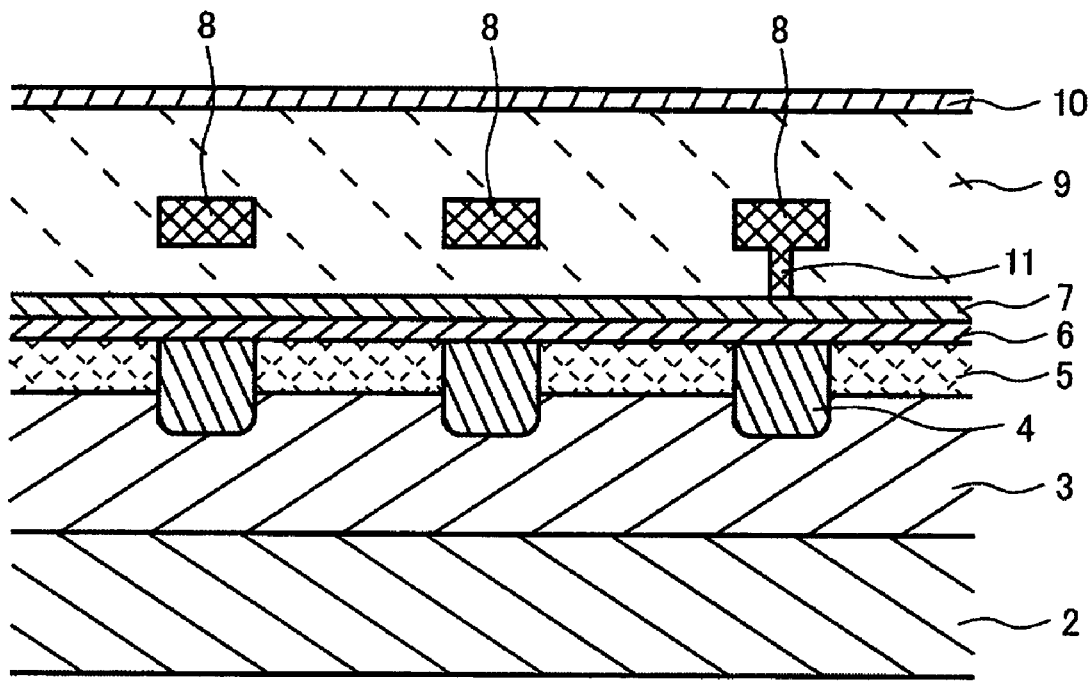
FIG. 14 is a cross-sectional view along line X-X of FIG. 13.

FIG. 1 is a schematic plan view of the solid-state image sensing device of the embodiment. A plurality of pixels P is formed in a matrix on a light-receiving region. The structure of each of the pixels P is the same as the structure of the image sensing portion 1$i$ shown in FIGS. 13 and 14 of the conventional art. Although not shown, first and second lens films, which will be described below, are formed on the pixels P.

On the other hand, on a non-light-receiving region, a light shielding cover BC made of metal and so on is formed so as to cover this region.

Next, the manufacturing method of such a solid-state image sensing device will be described with reference to FIGS. 2 to 11.

Figure 2:
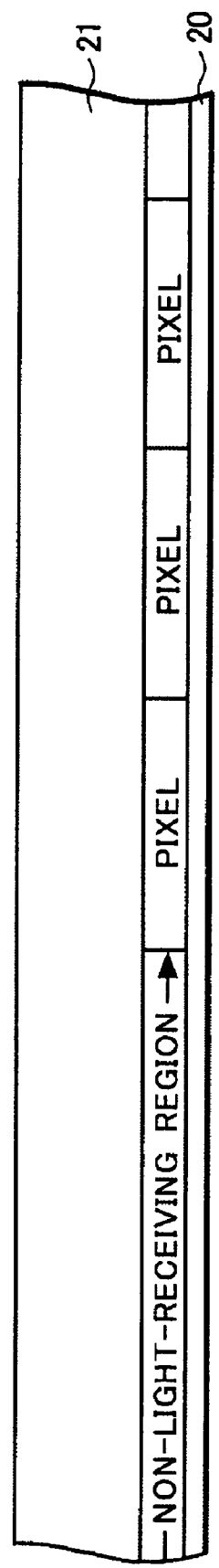
FIGS. 2-7, 9 and 11 are cross-sectional views showing in sequence manufacturing steps of the solid-state image sensing device of FIG. 1.

As shown in FIG. 2, the pixel P are formed on the light-receiving region on a silicon substrate 20. The structure of the pixel P is the same as the structure of the portion enclosed with a separated region 4 in the image sensing portion 1$i$ shown in FIG. 14 of the conventional art. An insulating film 21 (e.g. made of BPSG (borophosphosilicate glass) is formed on the pixels P. Although a logic circuit and so on (not shown) for controlling the pixels are formed in the non-light-receiving region on the silicon substrate 20, the invention is not limited to this and the pixels P can be formed in the non-light-receiving region as well.

Figure 3:
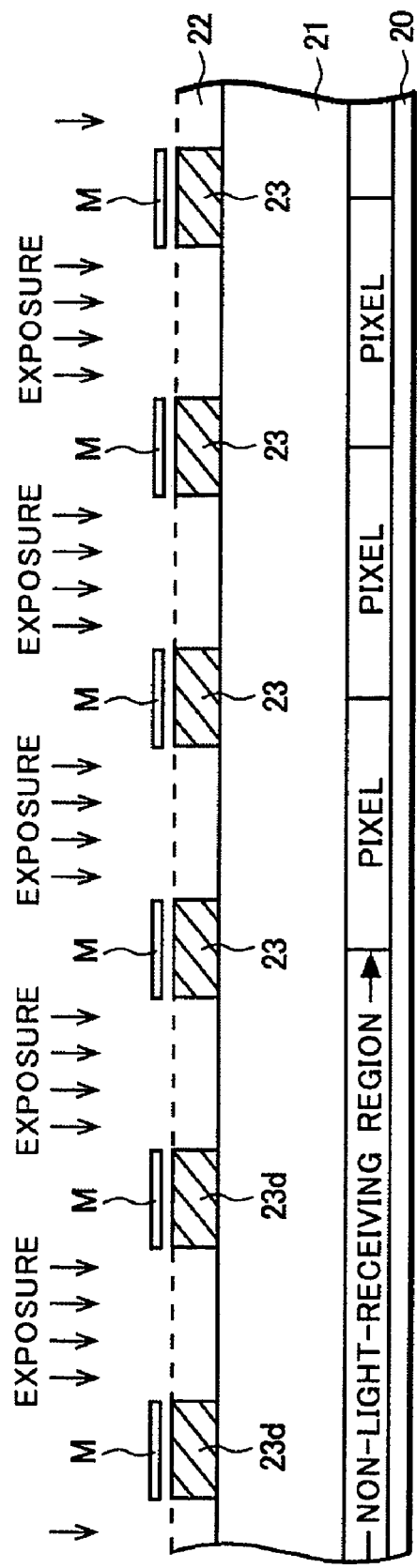

As shown in FIG. 3, a photoresist layer 22 made of positive resist is formed on the insulating film 21 in the light-receiving region, and a mask pattern 23 is formed from the photoresist layer 22 on boundaries between the pixels P by exposure and processing of the photoresist layer 22. That is, when the photoresist layer 22 is made of positive resist, a mask M is provided on the photoresist layer 22 above each of the boundaries of the pixels P and its periphery, and exposure and processing are performed to the photoresist layer 22 which is not covered with the mask M for removal thereof. This mask pattern 23 is a mask pattern for forming the first lens film and the second lens film, which will be described below, on the pixels P in the light-receiving region.

On the other hand, a dummy mask pattern 23$d$ is formed from the photoresist layer 22 in the non-light-receiving region. That is, when the photoresist layer 22 is made of positive resist, a mask M is provided on the photoresist layer 22 in the non-light-receiving region at the same intervals as those of the mask pattern 23 formed on the insulating film 21 in the light-receiving region. Then, exposure and processing are performed to the photoresist layer 22 which is not covered with the mask M for removing it. This dummy mask pattern 23$d$ serves as a mask pattern for forming the same first and second lens films on the logic circuits (or the pixels P) in the non-light-receiving region as those formed in the light-receiving region described below.

Note that when the photoresist layer 22 is made of negative resist, the mask M is provided on the photoresist layer 22 except the region positioned on the boundaries between the pixels P and its peripheries. Then, the photoresist layer 22 which is not covered with the mask M is left by exposure and processing (not shown).

Figure 4:
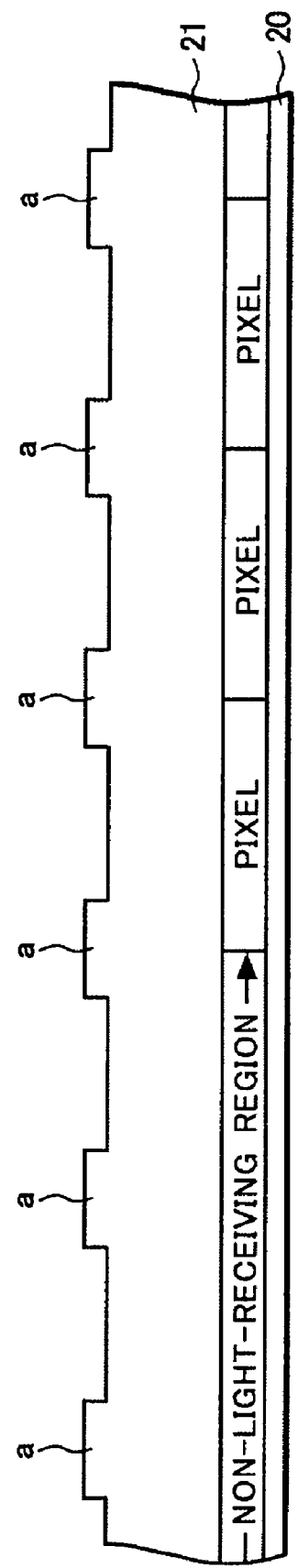

Then, as shown in FIG. 4, the mask pattern 23 and the dummy mask pattern 23$d$ are used as a mask to perform anisotropic etching (e.g. dry etching) to the insulating film 21 in both the light-receiving region and the non-light-receiving region, thereby forming convex portions a on the insulating film 21 positioned on the boundaries of the pixels P. At this time, the insulating film 21 is etched so as to have the convex portions a having a uniform height and shape in both the light-receiving region and the non-light-receiving region. The mask pattern 23 and the dummy pattern 23$d$ are then removed.

Figure 5:
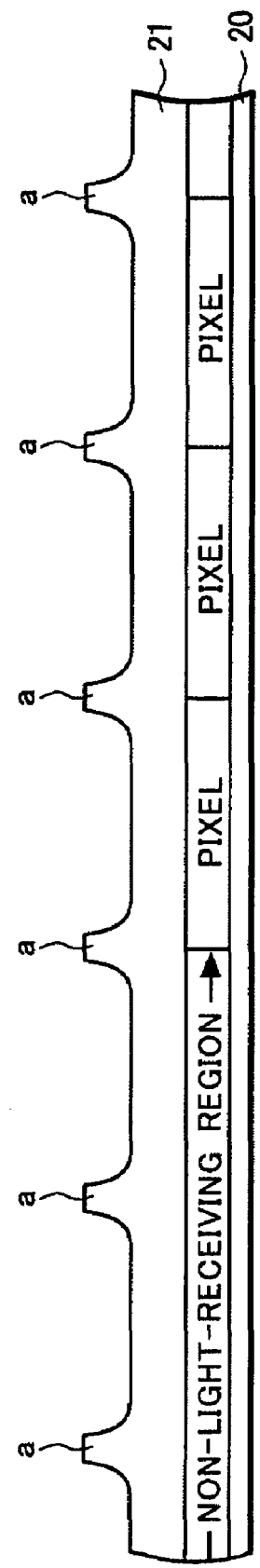

Then, as shown in FIG. 5, isotropic etching (e.g. wet etching) is performed to the whole surface of the insulating film 21 which has undergone the anisotropic etching to form a curved surface. The curvature of this surface is designed to direct light incident on the power supply lines to the middle of the pixel area, as explained below.

Figure 6:
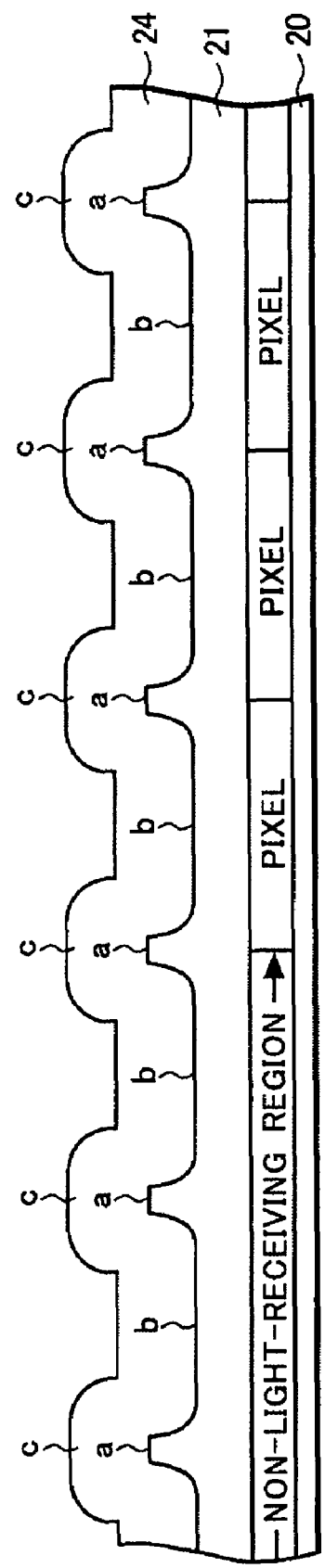

Then, as shown in FIG. 6, the first lens film 24 (e.g. made of silicon nitride) is formed on the whole surface of the insulating film 21 in both the light-receiving region and the non-light-receiving region. It is preferable that the first lens film 24 has a higher refractive index than the insulating film 21.

Furthermore, the first lens film 24 has concave portions b which has bottom surface following the curvature created at the step of FIG. 5. This curved surface of the concave portion b has such a predetermined shape and refractive index that light incident on a power supply line 8 (not shown but refer to FIG. 14) is refracted in a direction toward a center portion of a channel region 5 (not shown but refer to FIG. 14) formed in the pixel P.

Furthermore, the first lens film 24 has convex portions c each having a curved surface in a position above the boundary of the pixels P at a corresponding convex a of the insulating film 21. The convex portions c of this first lens film 24 have a uniform height and shape corresponding to the convex portions a of the insulating film 21 having a uniform height and shape.

Figure 7:
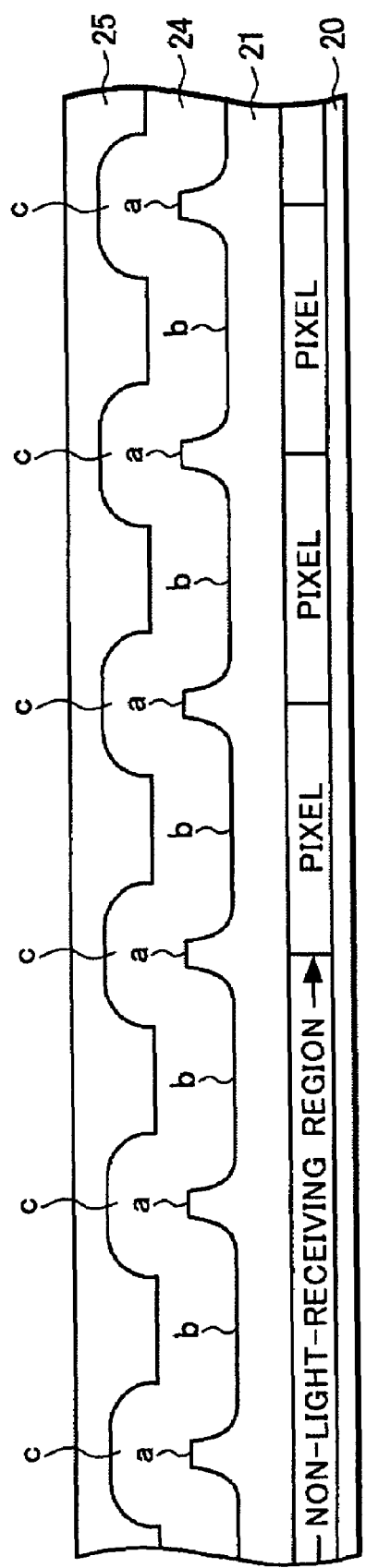

Then, as shown in FIG. 7, a planarizing film 25 (e.g. made of an organic film or a non-organic film) is formed on the whole surface of the first lens film 24 in both the light-receiving region and the non-light-receiving region. It is preferable that this planarizing film 25 has a lower etching rate than the first lens film 24 for an etching back process which will be described below.

The formation of the planarizing film 25 is performed, for example, by spin-coating an organic film, an non-organic film or a BARC. Since the convex portions c of the first lens film 24 have the uniform height and shape in both the light-receiving region and the non-light-receiving region, the described planarizing film 25 has a horizontal surface and a uniform film thickness on the whole surface of the first lens film 24.

Figure 8:
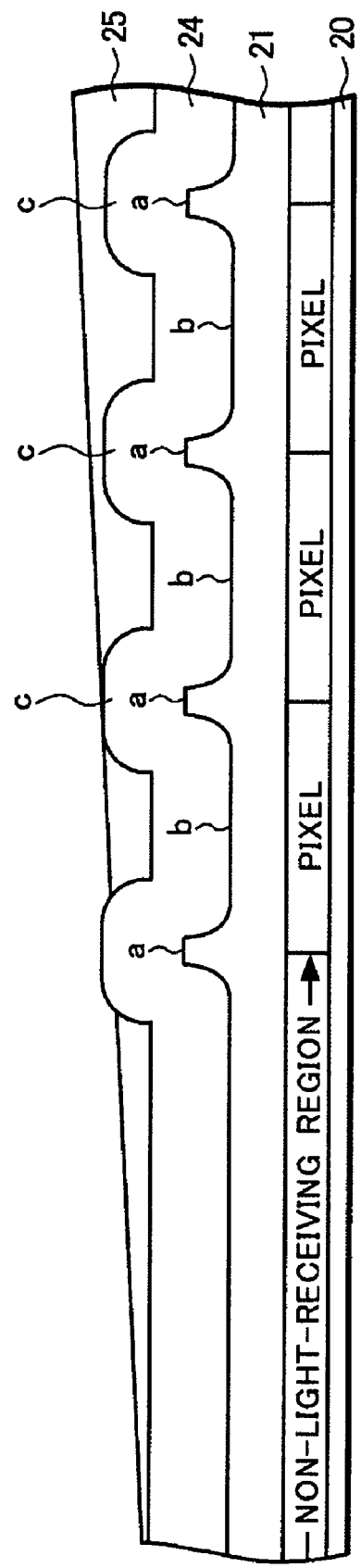
FIGS. 8 and 10 are cross-sectional views showing comparative examples based on a conventional manufacturing method.

If the first lens film 24 is not formed on the insulating film 21 of the non-light-receiving region, that is, if the dummy mask pattern 23*d* in the process shown in FIG. 3 is not formed so that the convex portions a are not formed on the insulating film 21 at the non-light-receiving region in the etching process shown in FIGS. 4 and 5, the planarizing film 25 is formed having an non-uniform film thickness. That is, in this case, as shown in FIG. 8, the planarizing film 25 is formed to be gradually thinned toward the non-light-receiving region from the light-receiving region, thereby having the non-uniform film thickness. Thus, the manufacturing method of the solid-state image sensing device of this embodiment of the invention includes a step of forming the dummy mask pattern 23*d* for forming the first lens film 24 in the non-light-receiving region so that the planarizing film 25 can have the uniform film thickness.

Figure 9:
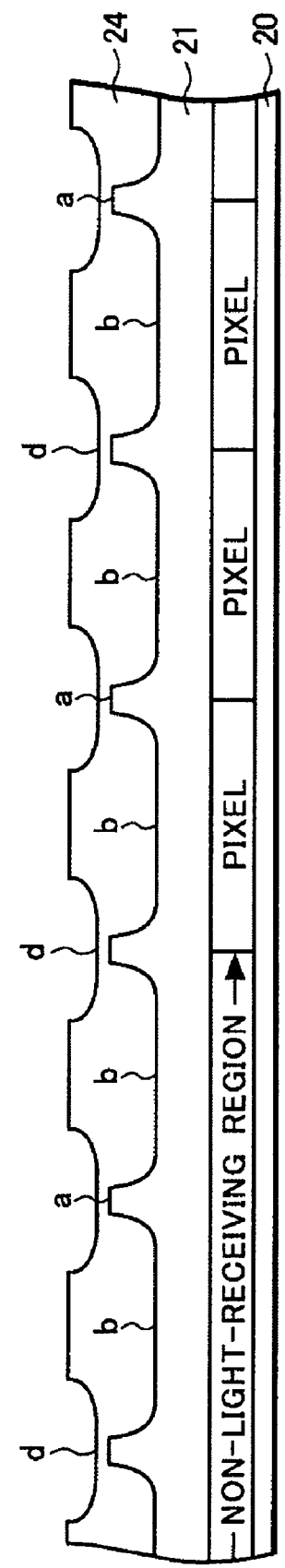

After the planarizing film 25 is uniformly formed on the whole surface of the first lens film 24, as shown in FIG. 9, the planarizing film 25 which is positioned above the boundaries of the pixels P is etched back in both the light-receiving region and the non-light-receiving region.

That is, the planarizing film 25 is uniformly etched back until top portions of the convex portions c formed on the first lens film 24 are exposed. After the top portions of the convex portions c formed on the first lens film 24 are exposed, the convex portions c are etched back faster than the planarizing film 25 since the etching rate of the planarizing film 25 is lower than the etching rate of the first lens film 24. Then, etching back is performed until the region other than the convex portions c of the first lens film 24 is exposed. By this processing, concave portions d having curved surfaces are formed on the surface of the first lens film 24 positioned on the boundaries of the pixels P. This concave portions d are formed having a uniform depth and shape in both the light-receiving region and non-light-receiving region.

Figure 10:
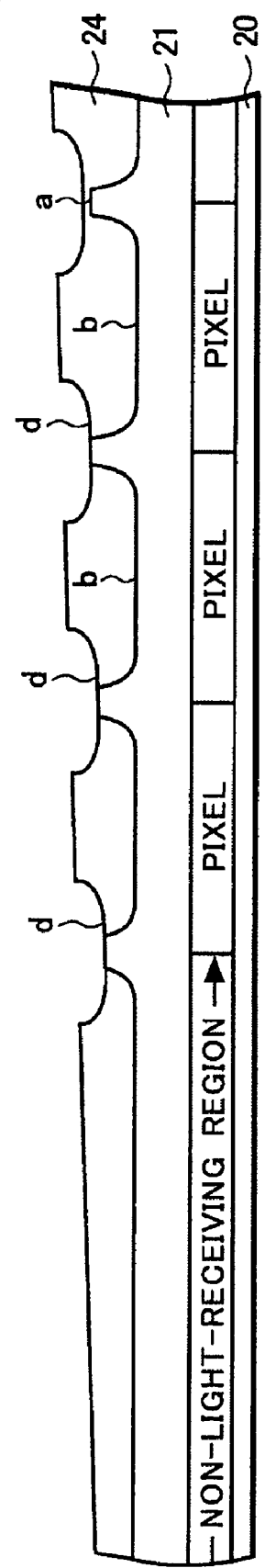

If the first lens film 24 is not formed on the insulating film 21 of the non-light-receiving region so that the planarizing film 25 is formed having a non-uniform film thickness, the concave portions d of the first lens film 24 formed by etching back the planarizing film 25 and the first lens film 24 is formed having a non-uniform depth and shape, as shown in FIG. 10. Therefore, the curved surfaces formed in the concave portions d of the first lens film 24 have a non-uniform shape so that a second lens film 26 described below forms a non-uniform shape.

Figure 11:
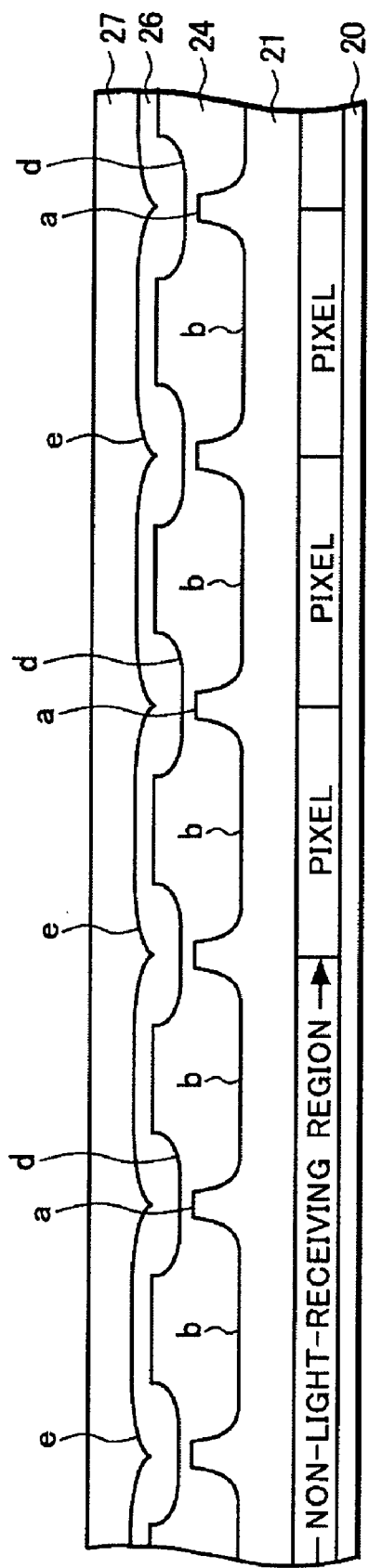
Figure 12:
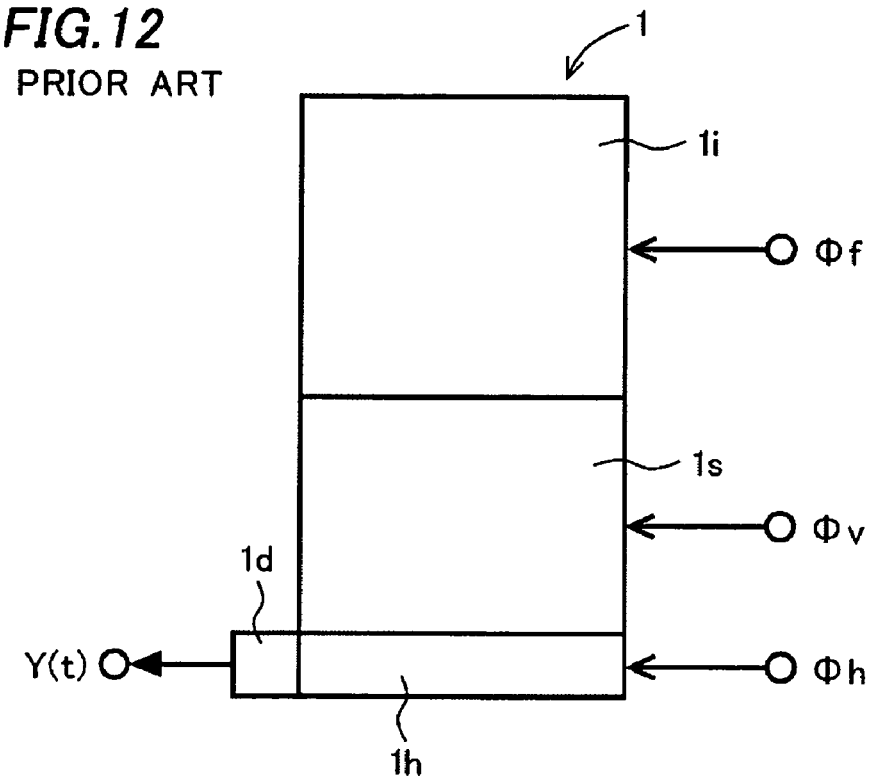
FIG. 12 is a schematic view showing a structure of a conventional solid-state image sensing device.

Next, as shown in FIG. 11, the second lens film 26 (e.g. made of silicon nitride) is formed on the first lens film 24. The second lens film 26 is formed in a uniform shape on the pixels P, having curved surfaces e on the boundaries of the pixels P. The curved surfaces e have a predetermined shape and refractive index for refracting light incident on the power supply line 8 (not shown but refer to FIG. 14) through the second lens film 26 into a direction toward a center portion of the channel region 5 (not shown but FIG. 14) formed on the pixels P.

Furthermore, a protecting film 27 is formed on the second lens film 26. It is preferable that the second lens film 26 has a higher refractive index than the protecting film 27.

As described above, since each of the concave portions b of the first lens film 24 and the curved surfaces e of the second lens film 26 can be formed having a uniform shape in both the light-receiving region and the non-light-receiving region, light can be uniformly condensed to each of the pixels P by refracting incident light. This prevents an error in light reception such as irregular color occurring when each of the pixels P receives light.

Furthermore, the manufacturing method of the solid-state image sensing device described above can be realized by using the conventional manufacturing method of the solid-state image sensing device so that the number of steps does not increase.

What is claimed is:

1. A method of manufacturing a solid-state image sensing device comprising a light-receiving region including a plurality of pixels and a non-light-receiving region adjacent the light-receiving region, the method comprising:
   forming an insulating film on the light-receiving region and the non-light-receiving region;
   forming a mask pattern on the insulating film at the light-receiving region and forming a dummy mask pattern on the insulating film at the non-light-receiving region;
   etching the insulating film using the mask pattern and the dummy mask pattern as a mask so as to form a plurality of convex portions on the insulating film;
   etching the insulating film with the convex portions so as to form curved surfaces on the insulating film;
   forming a lens film on the etched insulating film so as to cover the curved surfaces;
   forming a planarizing film on the lens film, the planarizing film having a lower etching rate than the lens film; and
   etching back the lens film and the planarizing film.

2. The method of claim 1, wherein the etching of the insulating film with the mask comprises etching the insulating film anisotropically, and the etching of the insulating film with the convex portion comprises etching the insulating film isotropically.

3. The method of claim 1, wherein the planarizing film comprises an organic film.

4. The method of claim 1, wherein the planarizing film comprises a non-organic film.

5. The method of claim 1, wherein the lens film has a higher refractive index than the insulating film.

6. The method of claim 1, wherein the lens film comprises a silicon nitride film.

7. The method of claim 1, wherein the mask pattern and the dummy mask pattern include a same pattern for a single pixel.

8. A method of manufacturing a solid-state image sensing device comprising a light-receiving region including a plurality of pixels and a non-light-receiving region adjacent the light-receiving region, the method comprising:
   forming an insulating film on the light-receiving region and the non-light-receiving region;
   forming a mask on the insulating film so that a mask pattern of the mask covers the light-receiving region and a dummy mask pattern of the mask covers the non-light-receiving region;
   etching the insulating film using the mask so as to form a plurality of convex portions on the insulating film;
   etching the insulating film with the convex portions so as to form curved surfaces on the insulating film;
   forming a first lens film on the etched insulating film so as to the curved surfaces;
   forming a planarizing film on the first lens film, the planarizing film having a lower etching rate than the first lens film;
   etching back the first lens film and the planarizing film; and forming a second lens film on the etched back first lens film.

9. The method of claim 8, herein the etching of the insulating film with the mask comprises etching the insulating film anisotropically, and the etching of the insulating film with the convex portion comprises etching the insulating film isotropically.

10. The method of claim 8, wherein the planarizing film comprises an organic film.

11. The method of claim 8, wherein the planarizing film comprises a non-organic film.

12. The method of claim 8, further comprising forming a protecting film on the second lens film, wherein the second lens film has a higher refractive index than the protecting film.

13. The method of claim 8, wherein the second lens film comprises a silicon nitride film.

14. The method of claim 8, wherein the mask pattern and the dummy mask pattern include a same pattern for a single pixel.

* * * * *